United States Patent
Böhler et al.

(10) Patent No.: US 11,951,851 B2
(45) Date of Patent: *Apr. 9, 2024

(54) SWITCHING DEVICE FOR A COIL (71) Applicant: BRUSA Elektronik AG, Buchs (CH)

(72) Inventors: Lukas Böhler, Flums (CH); Adrian Immler, Buchs (CH); Richard Knuchel, Buchs (CH); Pirmin Bader, Rebstein (CH)

(73) Assignee: BRUSA Elektronik AG, Buchs (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/202,495

(22) Filed: May 26, 2023

(65) Prior Publication Data
US 2023/0294527 A1 Sep. 21, 2023

Related U.S. Application Data (63) Continuation of application No. 17/253,961, filed as application No. PCT/EP2019/066662 on Jun. 24, 2019, now Pat. No. 11,673,480.

(30) Foreign Application Priority Data

Jun. 29, 2018 (DE) ...................... 10 2018 115 848.3

(51) Int. Cl.
B60L 53/12 (2019.01)
H02J 50/12 (2016.01)
(Continued)

(52) U.S. Cl.
CPC .............. B60L 53/12 (2019.02); H02J 50/12 (2016.02); H02J 50/70 (2016.02); H02J 50/90 (2016.02); H04B 5/0037 (2013.01); H02J 50/60 (2016.02)

(58) Field of Classification Search
CPC . B60L 53/12; H02J 50/12; H02J 50/70; H02J 50/90; H02J 50/60; H04B 5/0037;
(Continued)

(56) References Cited

U.S. PATENT DOCUMENTS 9,274,176 B2 * 3/2016 Day ................... G01R 31/3278
9,649,946 B2 * 5/2017 Ichikawa ................ B60L 50/40
(Continued)

FOREIGN PATENT DOCUMENTS

DE 112013004469 T5 5/2015
EP 2868516 A1 5/2015
(Continued)

Primary Examiner — Jared Fureman
Assistant Examiner — Michael J Warmflash
(74) Attorney, Agent, or Firm — Hoffmann & Baron, LLP (57) ABSTRACT A method of testing an impedance-sensitive system with a switching device, wherein the method comprises: switching the disconnecting device into the on-state configured to permit transmission of energy via the coil; implementing a first measurement with the impedance-sensitive system; switching the disconnecting device into the off-state configured to permit damping of the external positioning signal that couples into the coil so as to reduce the undesirable oscillations of the coil; implementing a second measurement with the impedance-sensitive system; performing a comparison of the first measurement and the second measurement; performing a verification of the comparison with a target specification; and displaying a correct function and/or a malfunction depending on the verification.

10 Claims, 5 Drawing Sheets (51) Int. Cl.
*H02J 50/70* (2016.01)
*H02J 50/90* (2016.01)
*H04B 5/00* (2006.01)
*H02J 50/60* (2016.01)

(58) Field of Classification Search
CPC ..... Y02T 10/70; Y02T 10/7072; Y02T 90/14; G01R 31/3278; H02M 1/126; H02M 1/44
See application file for complete search history.

(56) References Cited

U.S. PATENT DOCUMENTS

| | | | |
|---|---|---|---|
| 9,698,873 B2* | 7/2017 | Uchida | H02J 50/90 |
| 10,056,945 B2* | 8/2018 | Kim | H02J 50/12 |
| 10,457,149 B2* | 10/2019 | Ichikawa | H02J 50/12 |
| 10,523,062 B2* | 12/2019 | Bae | H02J 50/12 |
| 10,630,115 B2* | 4/2020 | Asanuma | H02J 7/00309 |
| 2011/0046438 A1* | 2/2011 | Iwaisako | H02J 50/402 |
| | | | 600/101 |
| 2012/0153739 A1* | 6/2012 | Cooper | H02J 50/12 |
| | | | 307/104 |
| 2012/0256585 A1* | 10/2012 | Partovi | H01F 27/366 |
| | | | 320/108 |
| 2014/0021958 A1* | 1/2014 | Day | G01R 31/3278 |
| | | | 324/418 |
| 2014/0312702 A1 | 10/2014 | Uchida | |
| 2015/0054344 A1* | 2/2015 | Ng | H02J 50/40 |
| | | | 307/104 |
| 2015/0224883 A1 | 8/2015 | Ichikawa et al. | |
| 2016/0311337 A1* | 10/2016 | Ichikawa | H02J 7/00034 |
| 2017/0005523 A1 | 1/2017 | Widmer et al. | |
| 2017/0054213 A1* | 2/2017 | Singh | H04B 5/0037 |
| 2020/0136434 A1* | 4/2020 | Leeks | H02J 50/12 |
| 2021/0268919 A1* | 9/2021 | Böhler | H04B 5/0037 |

FOREIGN PATENT DOCUMENTS

| | | |
|---|---|---|
| EP | 3103674 A1 | 12/2016 |
| EP | 3319206 A1 | 5/2018 |
| WO | WO 2015/099065 A1 | 7/2015 |

* cited by examiner

SWITCHING DEVICE FOR A COIL

CROSS-REFERENCE TO RELATED APPLICATIONS

The present application is a continuation of U.S. patent application Ser. No. 17/253,961, filed on Dec. 18, 2020, which is a U.S. National Phase of PCT/EP2019/066662, filed on Jun. 24, 2019, which claims priority to German Patent Application No. 10 2018 115 848.3, filed on Jun. 29, 2018, the entire contents of all of which are incorporated herein by reference.

BACKGROUND

Field

The invention relates to the technical area of inductive charging. In particular, the present invention relates to a switching device, a resonant circuit, a method for testing an impedance-sensitive system with a switching device, and a method for switching the switching device.

Related Art

In order to electrically charge a purely electric vehicle (EV, Electric Vehicle) or a hybrid vehicle (PHEV, Plug-in Hybrid-Electric Vehicle), which is operated with a combination of fuel and electrical energy, a system for inductive energy transmission can be utilized when the charging needs to take place without contact. A magnetic alternating field in a frequency range of from 25 to 150 kHz is generated in such a system. In this case, it must be noted that, outside of this frequency range, the limit values for the emission of electromagnetic waves are stipulated by internationally valid standards. This is because, even though essentially a magnetic field is used for energy transmission, this is an electromagnetic wave due to the fact that the magnetic field inherently changes. Due to the slow changes in the field strengths, the electromagnetic wave used during inductive charging, however, has a wavelength of several kilometers.

In order to adhere to these limits for the emission, it should be noted that the magnetic alternating field used for energy transmission functions with a basic oscillation in a range of from 25 to 150 kHz and only contains very minor harmonic waves. Therefore, filters are used to remove the interfering harmonic waves to the extent possible. In addition, in order to adhere to the internationally valid standards and guidelines, it must be ensured that an energy transmission only takes place when a certain quality of the coupling is achieved in that a certain alignment of the coupling elements is set with respect to one another, for example, by means of a positioning system as is described, for example, in publication EP 3 103 674 A1.

Publication EP 2 868 516 A1 describes a method for regulating the energy transmitted between two resonators of a system for contactless energy transmission.

A GPM (Ground Pad Module) with a primary coil is used on the stationary side and a CPM (Car Pad Module) with a secondary coil is used on the vehicle side as a coupling element for the energy transmission. The GPM and CPM form a transformer for the coupling and energy transmission. The physical alignment of the coupling elements with respect to one another is measured and set via a positioning signal, e.g., an RKS (Remote Keyless Entry System). Different transmission routes and different transmission techniques are used for the energy transmission and the transmission of the positioning signal.

Due to the use of different systems in the direct vicinity and particularly due to the use of electromagnetic waves, the systems may interfere with one another.

SUMMARY

Thus, an object of the present invention may be considered enabling an effective transmission of energy.

Accordingly, a switching device, a resonant circuit, a method for testing an impedance-sensitive system with a switching device, and a method for switching the switching device are specified.

The subject matter of the invention is specified by the features of the independent claims. Example embodiments and further aspects of the invention are specified by the dependent claims and the following description.

According to one aspect of the present invention, a switching device for a coil is indicated, having an input connection, for connecting the switching device to a coil electronics system and/or to a resonant circuit capacitor, and an output connection, for connecting the switching device to an end of the coil and/or to a resonant circuit capacitor. The switching device further has a disconnecting device. The disconnecting device is formed for disconnecting and connecting the input connection and the output connection and can be switched between an on-state and an off-state. In this context, disconnection may also mean that a current can still flow between the input connection and output connection, but this current is essentially less than it would be in a connected state.

The disconnecting device may be arranged at any freely selectable point in a primary oscillating circuit or resonant circuit of an energy transmission unit. In one example, the disconnecting device may be arranged between one or a plurality of resonant capacitors and a primary-side main coil. In another example, the disconnecting device may be arranged within the main coil. In yet another example, the disconnecting device may be arranged between a primary resonant circuit capacitor and a driving electronics system. Thus, it is possible to provide a resonant circuit with any preferred arrangement including a series connection of a capacitor with the switching device and another capacitor, a series connection of a capacitor with the switching device and a coil, and/or a series connection of a coil with the switching device and another coil. These series connections can be combined in any manner to the extent that a resonant circuit or oscillating circuit may have a plurality of such basic series connections. The switching device can thus be used at any points and in any combinations and in any preferred number. If the switching device is arranged between two capacitors, this can be considered an arrangement of the switching device within an individual capacitor, for example, within the resonant capacitor. If the switching device is arranged between two coils, this can be considered an arrangement of the switching device within an individual coil, for example, within the resonant coil.

In the on-state, the disconnecting device connects the input connection and the output connection to an on-impedance. The on-impedance may characterize the impedance between the input connection on the output connection which functions when the disconnecting device is in the on-state. In the off-state, the disconnecting device connects the input connection and the output connection to an off-impedance. The off-impedance may characterize the impedance between the input connection and the output connection which functions when the disconnecting device is in the off-state. The off-impedance has an increased value as compared to the on-impedance. The off-impedance enables a current flow between the input connection and the output connection and thus is formed such that it damps at least one external signal of a definable frequency, which external signal can be coupled into the coil. An external system may characterize a system which serves a functionality which is different than the system in which the switching device is installed, and particularly in which the coil is taking part, and to which the switching device is connected.

According to another aspect of the present invention, a resonant circuit is described, having the switching device, a coil, and a coil electronics system or adapter device. The coil, with a first coil connection, is connected to a first connection of the coil electronics system via the switching device. In addition, the coil and the coil electronics system are connected to one another via a second coil connection and a first connection of the coil electronics system.

According to yet another aspect of the present invention, a method for switching a switching device is indicated, including detecting the presence of an external signal and switching the disconnecting device into the off-state when this signal has been detected.

According to yet another aspect of the present invention, a method for testing an impedance-sensitive system with a switching device is indicated, particularly for testing an xOD, LOD, and/or FOD system. The term xOD may uniformly include all OD sensors, such as LOD or FOD. In contrast with a positioning system which essentially uses an electromagnetic wave for the transmission of information, the FOD system or LOD system may evaluate the change in inductance. The test method may be implemented as a self-test and may be a method for using a switching device in a self-test.

The method may include switching the disconnecting device into the on-state and implementing a first measurement with the impedance-sensitive system which is to be tested. Furthermore, the method may include switching the disconnecting device into the off-state and implementing a second measurement with the impedance-sensitive system. Due to the switching on and off of the disconnecting device, an impedance change of an object may be induced, to which the impedance-sensitive system responds. There is a comparison of the results of the first measurement and the second measurement and verification of the comparison with a target specification, particularly with an expected result. If the impedance-resistive system is functioning properly, a change in the impedance of the object should be detectable. The correct function and/or a malfunction is then displayed depending on the verification.

Each unit contains a main coil for the inductive and/or contactless transmission of electrical energy to a vehicle from a ground-side unit, a so-called Ground Pad Module (GPM), to a vehicle-side unit, a so-called Car Pad Module (CPM). The main coil on the energy-supplying side is characterized as the primary coil, and the main coil on the energy-receiving side is characterized as the secondary coil. The two main coils are coupled together via a resonant magnetic field which is generated by a coil electronics system. The energy is generally transmitted from the GPM to the CPM via this magnetic field. Even when an energy flow from the GPM to the CPM is assumed in the description, the reverse direction of transmission is obviously also possible.

However, the system for energy transmission may require even more sensors and/or subsystems in order to efficiently configure the operation and/or to increase the operational reliability. Examples of such additional systems and/or sensors are a Foreign Object Detection System (FOD) for detecting electrically conductive and/or magnetically functioning foreign objects, a Living Object Detection System (LOD) for detecting organic objects, and/or a positioning system (POS) which can ensure the correct alignment of the CPM as relates to the GPM. All of these systems may use electromagnetic waves and/or fields in order to execute their function. Because the resonant magnetic field used for energy transmission is also basically an electromagnetic wave and/or an electromagnetic field, this may result in mutual interference among structural elements, because generators for electromagnetic waves may themselves represent interferences for other electromagnetic systems even in the passive state.

Thus, for example, the main coil and/or energy transmission coil of the energy transmission system, particularly the primary coil, requires high quality in order to transmit as much of the magnetic energy generated thereby as possible to a receiver. A generator circuit which drives the coil may have an inverter or converter which, in turn, has diode paths which lead to an intermediate circuit. The intermediate circuit may be a voltage supply circuit which has several connection phases, for example, PE, N, L1. The designations L1, N, and PE characterize the lines of a single-phase electrical connection. L1 is the phase or the current-carrying conductor in the alternating current grid, N is the neutral conductor, and PE (Permanent Earth) is the ground or protective conductor. In addition to the diode paths, the inverter may have capacitors and capacitances for filtering or capacitances which are caused by parasitic effects and are not actually existing components, which enable an electrical circuit with the primary resonant circuit. Due to the combination of these different resonance-capable components, resonant circuits of high quality may result which can influence the signals from other systems or external systems such as, for example, LOD, FOD, and POS, and thus can limit the quality and performance of the systems.

When a POS system is used, it is possible that there is a further transmitter, in addition to the transmitter of the POS signals, due to the electromagnetic waves transmitted by the POS system based on excitations in the coils of the energy transmission system. In addition, there may be a coupling between the receiver coils of the positioning system and the coil of the energy transmission system, i.e., the coupling of systems or subsystems of different functionality. Due to this coupling, the desired signal propagation of the positioning signal of the positioning system can be superposed depending on the position of the transmitter. An undesired coupling of two, for example, orthogonally arranged receiving antennas may lead to distortions of the measuring signals of the sensor values which do not correspond to the signal propagation. In other words, the distortion of the measuring signals may lead to measuring signals in the sensors which do not correspond to the actual signals, whereby the processing of the measuring signals may be more difficult.

The switching device can prevent or substantially reduce such interferences of an external system, i.e., of a system which is not functionally part of the energy transmission system or which has a different function than energy transmission, until the interferences are no longer noticeable. The energy transmission system may not be essentially active while the external system is being used. The control unit may be present in order to ensure that the energy transmission is switched off before another subsystem starts with the operation. In one example, it may also be possible, however, to operate another subsystem during the energy transmission.

According to a further aspect of the present invention, the off-impedance is further formed to damp an interference with a frequency which is greater than the definable frequency of the external signal. In addition to a signal of the external system, an EMC interference may also form on the coil connected to the switching device. While the frequency of the external signal may be in the kilohertz range, an EMC interference may be in the megahertz range. Thus, the switching device may essentially have two strongly damping frequency ranges: the range of the external signal itself, on the one hand, in order to not interfere with itself, and a high frequency range, on the other hand, in order to damp the high frequency EMC signal.

According to yet another aspect of the present invention, the switching between the on-state and the off-state may be coupled to the switching of the at least one external signal.

Because the process of energy transmission together with the energy transmission system is usually switched off while the external system is active, the switching device can be switched from the on-state, in which a good energy transmission is possible via the switching device, into the off-state, in which good fault suppression is possible for the signal of the external system. Thus, the switching device may be connected to the external system in order to detect when the external system is switched on. In one example, there may be communication via control units of the external system and of the energy transmission system.

According to a further aspect of the present invention, the disconnecting device is a switch with an impedance connected in parallel. In one example, the disconnecting device is an impedance which can be short-circuited.

The switch can short-circuit the impedance essentially in order to switch off, short-circuit, and/or bypass the impedance to ensure good energy transmission.

According to yet another aspect, the impedance connected in parallel is at least an impedance which is selected from the group of impedances, the group consisting of an effective impedance, a blind impedance, a resistance, a capacitor, a parasitic element, a parasitic impedance, and a coil. In the event that this impedance connected in parallel is short-circuited by the disconnecting device, the impedance connected in parallel essentially no longer has any effect. A parasitic element, particularly a parasitic impedance and/or a parasitic capacitance, may develop, for example, due to the layout of a PCB or circuit board by means of the traces and may be available but does not correspond to any discrete structural element.

According to a further aspect of the present invention, the disconnecting device is a transformer. The transformer, for example, may be a transformer through which current, which is necessary for the energy transmission, flows in an on-state, and an impedance is connected in an off-state, while the energy transmission is deactivated. When connected, this connected impedance can draw power, for example, from the electrical current induced in the main resonant circuit.

According to a further aspect of the present invention, the switching device has a control unit, wherein the control unit is configured to directly and/or indirectly detect the presence of the external signal and to switch the disconnecting device.

For the direct detection of the external signal, the control unit may have or use a sensor which enables the detection that the external signal is penetrating the coil of the energy transmission system and, in the event of detection of the external signal, the disconnecting device can be switched off. In the example of a positioning signal, the control unit may rely on a positioning system available in the region of the coil in order to detect the presence of a positioning signal. In another example, the control unit, however, may also receive a notification of the switch-off of the energy transmission system and control the disconnecting device accordingly.

For the indirect detection of the external signal, communication may take place between the CPM and GPM via a communication channel, for example, via WLAN. The switching of the disconnecting device can be influenced by means of this communication. For the communication, software-based state machines may be configured in the GPM and in the CPM which directly control the disconnection between the GPM and the CPM in that they exchange messages via the communication channel. The communication may be triggered by commands of the vehicle to be charged, particularly the CPM thereof. With indirect detection, the control unit thus may obtain a signal which indicates to the control unit that an external signal is present with a high degree of probability, but the control unit does not directly evaluate the external signal. In the example of the positioning system, the control unit may obtain information from the transmitter of the positioning system via the communication channel that the external signal, i.e., the positioning signal, is being transmitted.

According to a further aspect of the present invention, the control unit is configured to switch the disconnecting device in order to implement the test.

Thus, characteristics in the resonant circuit can be modified with the main coil in order to test sensors, such as the LOD or FOD sensor. Alternatively, a coupling factor between the CPM and GPM may also be tested.

According to a further aspect of the present invention, a CPM and/or a GPM is indicated which has the switching device, the coil, and the coil electronics system.

According to yet another aspect of the present invention, a computer-readable storage medium is provided, on which a program code is stored which executes at least one of the methods when it is executed by a processor. A control unit or a controller may also utilize such a processor.

A floppy disk, a hard disk, a USB (Universal Serial Bus) storage device, a RAM (Random Access Memory), a ROM (Read Only Memory), or an EPROM (Erasable Programmable Read Only Memory) is used as a computer-readable storage medium. An ASIC (Application-Specific Integrated Circuit) or an FPGA (Field-Programmable Gate Array) as well as SSD (Solid-State-Drive) technology or a flash-based storage medium may also be used as the storage medium. A web server or a cloud may likewise be used as the storage medium. A communication network may also be considered a computer-readable storage medium, such as, for example, the Internet, which may enable the downloading of a program code. Wireless network technology and/or wired network technology may also be used.

According to yet another aspect of the present invention, a program element is provided, which executes at least one of the methods when it is executed by a processor.

BRIEF DESCRIPTION OF THE DRAWINGS

Further example embodiments of the present invention are described in the following with reference to the figures.

DETAILED DESCRIPTION

The representations in the figures are purely schematic and not true-to-scale. In the following description of FIGS. 1 to 10, the same reference numerals are used for equivalent or corresponding elements.

In this text, the terms "capacitor" and "capacitance" as well as "coil" or "inductor" and "inductance" are used synonymously and should not be interpreted in a limiting manner, unless indicated otherwise. In addition, the terms "energy" and "power" are used equivalently and should not be interpreted in a limiting manner, unless indicated otherwise.

Figure 1:
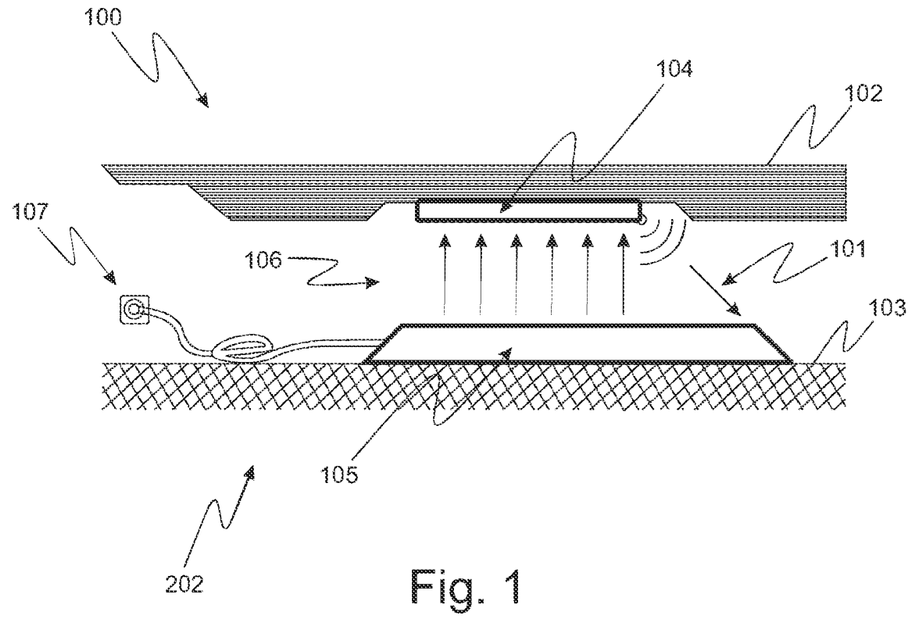
FIG. 1 shows an inductive charging system according to an example embodiment of the present invention.

FIG. 1 shows an inductive charging system 100 or system 100 for the transmission of energy according to an example embodiment of the present invention. In this case, a side view of a system for contactless charging of an electric vehicle is shown. A car pad module (CPM) 104, which is used to supply the vehicle 102 with current, is situated underneath a vehicle chassis 102. A magnetic field 106 is used for the transmission of the energy, which magnetic field inductively provides the energy from a ground pad module (GPM) 105 fixedly mounted to a base 103. The energy needed for the charging is drawn from the main connection 107, which may be alternating current (AC) or direct-current (DC). A separate connection 101, which may use, for example, a wireless protocol such as a WLAN (Wireless LAN) or NFC, can be used for communication between the CPM 104 and GPM 105. This connection can be used as a feedback channel 101 or as a communication channel 101, via which the CPM 104 and GPM 105 can exchange information. Both the magnetic field for energy transmission 106, as well as the radio signal 101, are electromagnetic waves which may have, however, different frequencies.

Figure 2:
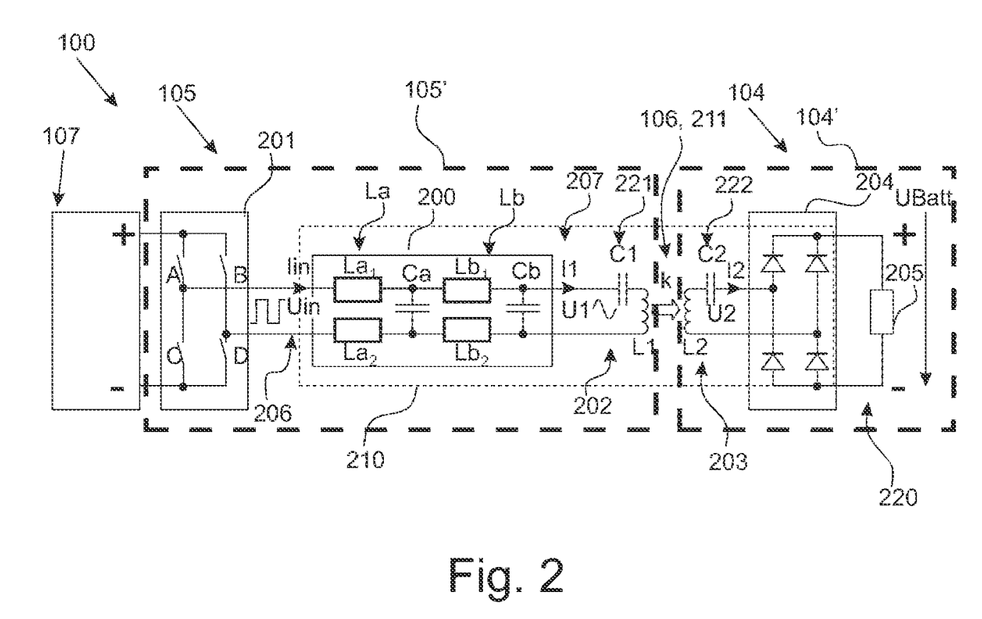
FIG. 2 shows a block diagram of an inductive charging system according to an example embodiment of the present invention.

FIG. 2 shows a block diagram of an inductive charging system 100 according to an example embodiment of the present invention. A system for inductive energy transmission is considered, which can be used for contactless charging of an electric vehicle. A magnetic alternating field 106 in a frequency range of from 25 to 150 kHz, for example, is generated in such a system. In this case, it must be noted that, outside of this frequency range, the limit values for the emission of electromagnetic waves are stipulated by internationally valid standards. In order to adhere to these limits, it should be noted that the magnetic alternating field 106 functions with a basic oscillation in a range of from 25 to 150 kHz and only contains very minor harmonic waves.

On the other hand, the efficiency of the power transmission should be as great as possible and therefore a square-wave signal is generated with the basic frequency of the magnetic alternating field with electronic switches within an inverter 201, for example, by means of a MOSFET or IGBT; this results in very low losses. However, the square-wave signal contains significant harmonic waves. These harmonic waves can be filtered out very well with a filter 200, for example, an LC filter 200. The filter 200 in this case may be designed in different ways. A 4th order filter 200 is shown by means of example in FIG. 2; however, other configurations of capacitors and coils are also possible. The input current $I_{in}$ and the input voltage $U_{in}$ are applied at the input 206 of the filter 200. The filter 200 has two input coils $La_1$ and $La_2$, connected in parallel, and the filter input capacity Ca, as well as the output coils $Lb_1$ and $Lb_2$, connected in parallel, and the filter output capacitor Cb. Instead of the two input coils $La_1$ and $La_2$ connected in series, a single input coil La can be used. Instead of the two output coils $Lb_1$ and $Lb_2$ connected in series, a single output coil Lb can be used.

Input coils $La_1$ and $La_2$ are connected directly to the outlet of the inverter 201. In this case, directly means that no further structural element is connected in between. A capacitor connected in series in this case should not turn a direct connection into an indirect connection. The term "direct" may particularly be used to express that connection points of corresponding components coincide and/or have the same potential. Output coils $Lb_1$ and $Lb_2$ at the outlet 207 of the filter 200 are connected directly to coils $La_1$ and $La_2$ as well as the primary resonant circuit 202. The primary resonant circuit 202 is supplied with the voltage U1 and the current I1 or IL, which originates from the alternating current generated by the inverter 201. Due to the effect of the filter 200, the primary current I1 and the primary voltage U1 have a sinusoidal curve.

The primary resonant circuit 202 has the primary resonant coil L1 or primary coil L1 and the primary resonant capacitor C1 221. The primary resonant circuit 202 converts the current I1 and the voltage U1 into the magnetic alternating field 106. The magnetic alternating field 106 is coupled into the secondary resonant circuit 203 with a coupling factor k and transmits the energy from the primary circuit to the secondary circuit 203 by means of a resonant and inductive energy transmission.

The secondary resonant circuit 203 has the secondary resonant coil L2 or secondary coil L2 and the secondary resonant capacitor C2 222. Because the secondary resonant circuit 203 is adjusted to the resonant frequency of the primary resonant circuit 202, the secondary resonant circuit 203 is excited to oscillate by means of the magnetic field 106 to the extent that the secondary current I2 and the secondary voltage U2 result. These are supplied to the rectifying device 204 or to the rectifier 204, which may provide at its outlet 220 a direct voltage of a load 205, for example, of a battery 205, of an intermediate circuit 205, of a traction circuit 205, or of an output-side HV-DC 205 on the side of the CPM 104.

The inductive charging system 100 is supplied via a direct-voltage source 107 or input-side HV-DC (High Voltage-Direct Current) and/or via alternating voltage 107.

The energy transmission system 100, for example, an ICS system 100, has a base station 105 or GPM 105, a remote device 104 or a CPM 104, wherein the base station 105 and the remote device 104 can be loosely connected to one another via an inductive coupling and the feedback channel 101. A loose coupling can be assumed upon a corresponding positioning of the CPM 104 as compared to the GPM 105.

The base station 105 or GPM 105 has the primary circuit 202, and the remote device 104 or CPM 104 has the secondary circuit 203. The primary circuit 202 has coil L1, and the secondary circuit has coil L2. If coils L1 and L2 are aligned with each other, magnetic fields 106, which are generated by the coils, can implement the other respective coil L1, L2. The part of the magnetic field which implements the other respective coil L1, L2 forms the inductive coupling with the coupling factor k. This coupling forms a loosely coupled transformer 211. The part of the magnetic field 106 which is outside of the other respective coil L1, L2 forms a stray capacitance. The lower the portion of the stray capacitance formed, the greater the coupling factor k. However, because no transformer with a core can be formed in which the coupling factor k is essentially constant due to the mobility of the GPM 105 and CPM 104 with respect to one another, the coupling factor with the loosely coupled transformer is variable and depends, for example, on the relative position of the GPM 105 and CPM 104 with respect to one another.

The functional components of the GPM 105 are essentially combined in the primary function block 105', and the functional components of the CPM 104 are essentially combined in the secondary function block 104'.

Figure 3:
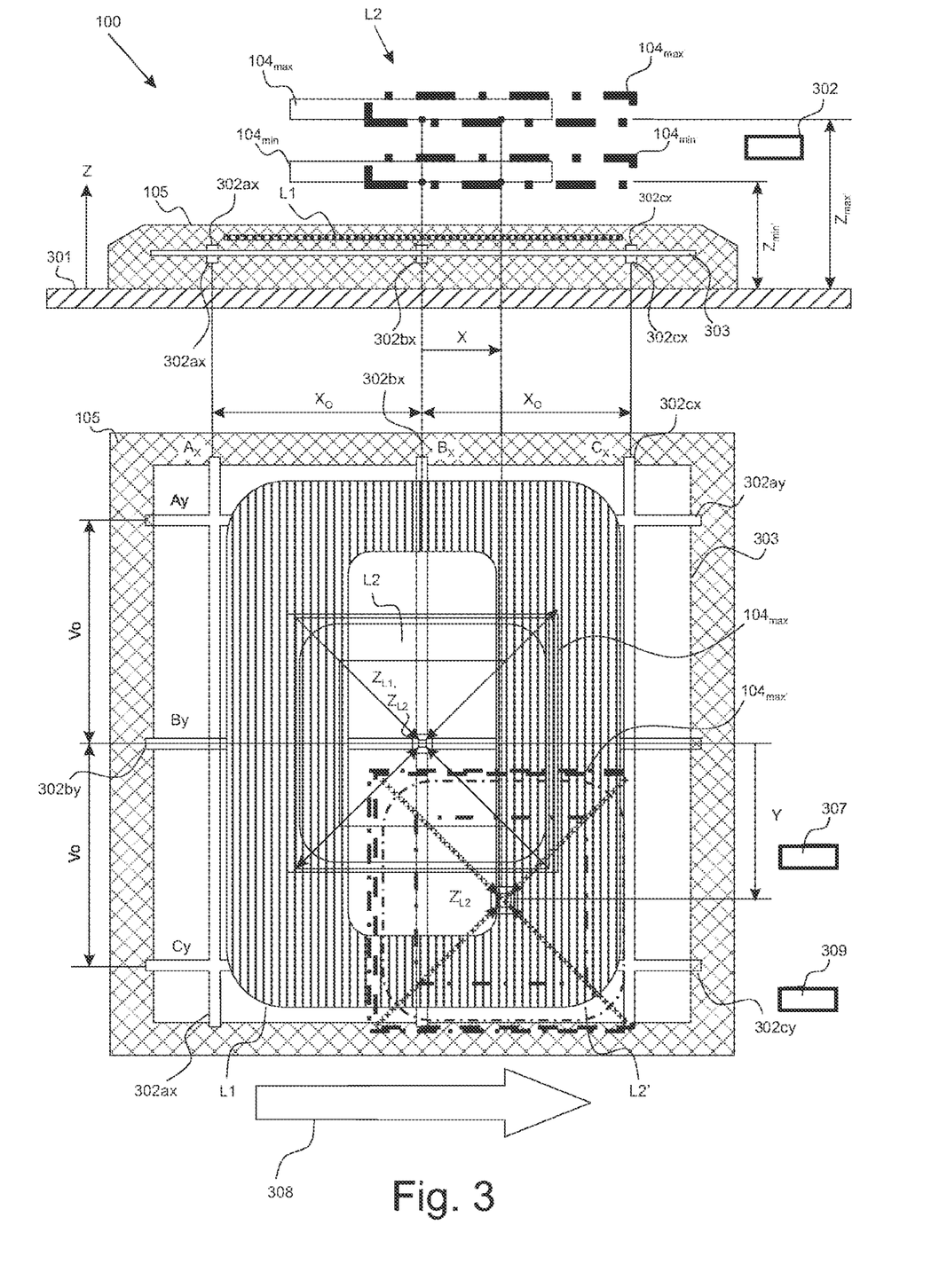
FIG. 3 shows a side view and a top view of a CPM and a GPM in various alignments as relates to one another according to an example embodiment of the present invention.

FIG. 3 shows a side view and a top view of the CPM 104 and a GPM 105 in various alignments as relates to one another according to an example embodiment of the present invention. The two transformer elements 104, 105 or the GPM 105 and the CPM 104 are shown as a part of a system 100 for inductive energy transmission in a position $104_{min}'$, $104_{max}'$ offset as relates to each other and in the precisely coaxial position $104_{min}$, $104_{max}$ at different heights Z. One of the transformer elements 105 is assigned to the primary part of the energy transmission system and is positioned, for example, on or in the ground 301 in the region of a charging station, a garage for the vehicle, etc., with inductive charging arrangements for at least partially electrically driven vehicles. When a vehicle is situated in the charging position, the primary coil L1 of the GPM 105 lies precisely coaxially underneath the typically smaller secondary coil L2 of the second, receiving transformer element 104, $104_{max}$ or CPM 104, $104_{max}$, which is mounted on the vehicle to be charged (not shown in FIG. 1) and is connected to the traction battery thereof for supplying energy wirelessly received by the CPM $104_{max}$. The energy for charging the batteries of the vehicle in this case is magnetically-inductively transferred from the GPM 105 to the CPM 104, $104_{max}$, wherein this transmission is more effective, the more precisely the coils L1, L2 are positioned over one another.

In order to ensure the most coaxial position possible of coil L1 as relates to coil L2, the energy transmission system 100 is equipped with or connected to a positioning system 302, 302ax, 302bx, 302cx, 302ay, 302by, 302cy, 307, which uses a positioning signal (POS). The positioning system is configured such that it can facilitate or even autonomously provide the assuming of a position with good alignment of the coils L1, L2 as relates to one another in order to achieve good coupling of the coils L1, L2.

Regardless of how the relative position of the coils L1, L2 as relates to one another is displayed, indicated, or evaluated in any case for the automatic control of the vehicle into the charging position, a prerequisite for such type of positioning aid is the determination of the position of the secondary coil L2 over the center of the primary coil L1. The charging system 100 is configured to use an inductive method for the positioning which is configured to use parts of the charging system 100 which are available anyway for the formation of the magnetic circuit for energy transmission. To this end, the secondary coil L2 is excited with a frequency of about 130 kHz, particularly 125 kHz, during the positioning process and thus functions as a transmitting coil in the CPM 104 for the positioning system 302, 302ax, 302bx, 302cx, 302ay, 302by, 302cy, 307.

The GPM 105, which has the primary coil L1, is equipped with a total of 6 "solenoid windings" 302ax, 302bx, 302cx, 302ay, 302by, 302cy, which are used as measuring coils or positioning-signal receiving devices 302ax, 302bx, 302cx, 302ay, 302by, 302cy. These devices are situated about ferrite components 303 of the GPM 105, particularly about a ferrite shield 303, which shields the electronic components of the primary part against the primary coil L1. For precise position determination, 3 measuring coils are oriented in each of the orthogonal directions, wherein the directions are characterized as the x-direction and y-direction. The 3 measuring coils are arranged symmetrically, with a defined distance $x_0$ and $y_0$, as relates to the center of symmetry $Z_{L1}$ of coil L1. A different number and other arrangements of positioning coils are also conceivable.

The field generated by the secondary coil L2, by means of the positioning system 302, induces various induced voltages, depending on the position of coil L2 as relates to coil L1, due to the individual windings 302ax, 302bx, 302cx, 302ay, 302by, 302cy. Due to an evaluation unit 307 or control unit 307 of the positioning system in the GPM 105, the X/Y position of the CPM 104 as compared to the GPM 105 can be determined from these voltages by means of a correspondingly designed electronics system. The GPM 105 is situated on the ground 301 underneath the vehicle, and the CPM, for example, is mounted underneath the vehicle. The X/Y position of the CPM 104 as compared to the GPM 105 can be determined independently of the height Z, i.e., independently of the vertical distance between the coils L1, L2, perpendicular to the planes thereof. Directions X and Y and the height Z are shown as arrows in FIG. 1. The direction of travel of the vehicle may extend in the X direction, as is shown by arrow 308.

The system 105 of the charging station or of another primary part typically communicates with the system 104 of the vehicle via wireless connections 101, for example, radio, WLAN, or Bluetooth. Thus, the information determined in the evaluation unit 307 can also be transmitted to the vehicle via the relative position of the energy transmission coils L1, L2 as relates to one another and from there transmitted to a display or a similar representation unit and made accessible to the driver via interfaces, for example, a fieldbus, particularly a CAN bus (Controller Area Network).

The magnetic measuring field (not shown in FIG. 1) may be generated by a separate transmitting antenna instead of by the secondary coil L2 of the CPM 104 attached, for example, to the vehicle. This separate antenna may also be provided as a supplement to a CPM 104, which generates a magnetic measuring field itself, and integrated into this CPM 104. This transmitting antenna may be formed, for example, in the form of a rod antenna or also as a solenoid antenna and, in any case, may be attached to the vehicle also outside of the CPM 104 as an external transmitting antenna. Optionally, a coil about ferrite elements of the CPM 104 would also be conceivable as the transmitting antenna.

During the position determination with the aid of the positioning system, the voltages occurring at windings 302*ax*, 302*bx*, 302*cx*, 302*ay*, 302*by*, and 302*cy* are determined as a function of the position, particularly as a function of the lateral offset between the centers of symmetry $Z_{L1}$ and $Z_{L2}$ and/or $Z'_{L2}$ of coils L1, L2 of the CPM 104 and GPM 105, by means of at least one voltage measurement configuration connected to the measuring coils 302*ax*, 302*bx*, 302*cx*, 302*ay*, 302*by*, 302*cy*, which is integrated into the evaluation unit 307 or may be connected upstream thereof. The magnetic measuring field is generated by coil L2. When there is a great distance between the CPM 104 and the GPM 105 as relates to one another, the effect of coil L2 can be boosted by an external antenna. As the distances become smaller, the position determination can be implemented with the aid of the magnetic measuring field, which is generated by coil L2 alone, without the use of the external antenna.

Thus, each unit contains a main coil L1, L2 for the inductive and/or contactless transmission of electrical energy to a vehicle, from the GPM 105 to the CPM 104. The main coil on the energy-supplying side is also characterized as the primary coil L1, and the main coil on the energy-receiving side is characterized as the secondary coil L2. The two main coils are coupled together via a resonant magnetic field 106 which is generated by a coil electronics system. The energy is generally transmitted from the GPM 105 to the CPM 104 via this magnetic field.

In addition to the system for positioning 302, 307 POS, the energy transmission system 100 may have further systems and/or sensors. For example, in addition to measuring coils 302*ax*, 302*bx*, 302*cx*, 302*ay*, 302*by*, 302*cy*, sensors of an FOD system for detecting electrically conductive or magnetically functioning foreign objects or of an LOD system for detecting organic objects may be present. All of these systems may use electromagnetic waves and/or fields in order to execute their function.

Because the resonant magnetic field used for energy transmission is also basically an electromagnetic wave and/or an electromagnetic field, this may result in mutual interference among structural elements, because generators for electromagnetic waves may themselves represent interferences for other electromagnetic systems even in the passive state in that they are excited to resonance and themselves become a transmitter which, however, usually functions as an interfering transmitter for the actual signal.

The main coil L1 or energy transmission coil L1 requires high quality. Due to the additional electronic structural elements such as an inverter with diode paths and capacitors, resonant circuits of high quality can result which influence the signals of systems LOD, FOD, and POS, 302, 307 and thus may lead to a limitation of the quality and performance of systems LOD, FOD, and POS, 302, 307. In the case of a positioning system 302, 307 POS, a second transmitter may result, because the primary resonant circuit 202 can be excited to oscillate. In addition, there may be a magnetic coupling between the main coil L1 and the measuring or receiver coils 302*ax*, 302*bx*, 302*cx*, 302*ay*, 302*by*, 302*cy* of the positioning system 302, 307. Due to this magnetic coupling via the electromagnetic induction placement, signals of the sensors can be transmitted to other physical positions in space by means of induction of the measuring currents or by means of induced currents. Sensors at these other physical positions then do not only measure the useful signal of the transmitter of the signal but also superpositions of this useful signal with the signals which stem from sensors at the other positions.

Even though the frequencies are far apart, this should not lead to interferences of the systems among one another. However, component tolerances can ensure that there are reactions of individual circuits even though the signals are in different frequency ranges and are not even intended for them. This can lead to destruction of the components because the systems are functioning with very different voltages. While POS, LOD, FOD function with voltages in the µV range, the energy transmission system, however, functions in an essentially higher voltage range with approximately 6000 V and could damage the electronics of other systems.

Figure 4:
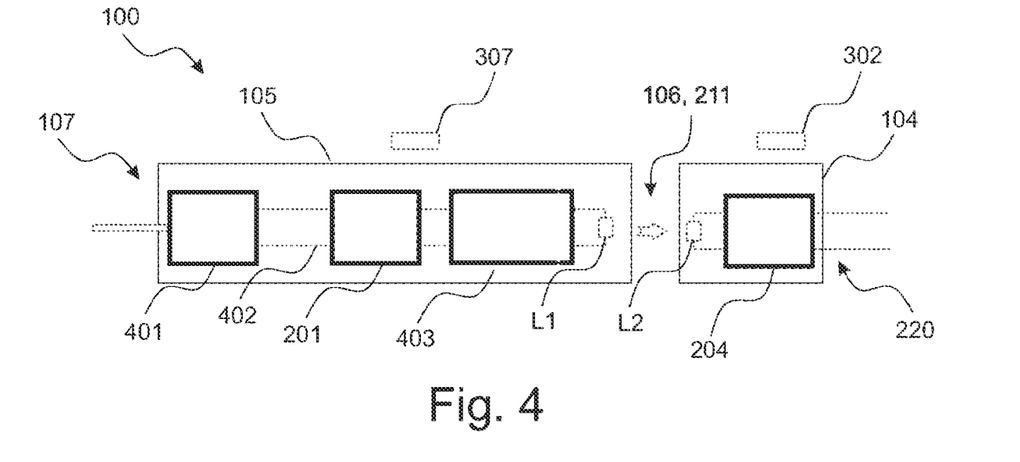
FIG. 4 shows a schematic block diagram of an energy transmission system with the energy transmission for better understanding of the present invention.

FIG. 4 shows a schematic block diagram of an energy transmission system with the energy transmission for better understanding of the present invention. FIG. 4 shows the energy transmission system 100 with the power supply 107 or mains 107 of the GPM 105 which is converted into an intermediate circuit voltage HVDC of a direct-current intermediate circuit or a primary-side HVDC by means of a PFC device 401. This intermediate circuit voltage is converted into a PWM voltage with $U_{in}$ and $I_{in}$ by means of the inverter 201 and supplied to the coil electronics system 403, the adapter switching block 403, or the adapter device 403, in which the components such as the filter 200 and resonant capacitor C1 are combined which drive the primary coil L1. Via the primary coil L1, the energy is transmitted, in the form of a power flow, to the secondary coil L2 of the CPM 104, via the magnetic field 106, where it is converted back into the intermediate circuit voltage of the vehicle by the rectifying device 204, which voltage is provided at the outlet 220 as a secondary HVDC. The primary-side HVDC and the secondary-side HVDC are independent of one another. During this energy transmission, the positioning system POS 302, 307 is inactive or switched off so that the power flow is not disturbed. Thus, the positioning system POS 302, 307 is only showed with dashed lines in FIG. 4.

The components such as, for example, the resonant capacitor C1, 221, used in an inductive charging system for executing oscillations, in addition to the coil L1, are not shown in FIGS. 4 to 8 for the sake of simplicity. Thus, particularly in FIGS. 4 to 8, the resonant capacitors C1, 221 of the primary resonant circuits are not shown, which are arranged at any points in the feed and return lines and in any quantity between the primary coil L1 and the filter 200. For reasons of insulation, it may be, for example, that a further capacitor is arranged in the branch of coil L1 parallel to the branch in which the resonant capacitor C1, 221 is arranged. Thus, in FIGS. 4 to 8, the primary resonant circuit 202 is essentially only represented by the primary coil L1. All components of a primary resonant circuit such as, for example, the primary resonant capacitor 221, are available, however, even if they are not shown in the figures. The resonant capacitor C1, 221 may be arranged at any point in the current path of the resonant circuit 202, and the resonant circuit 202 can be manipulated at any point by means of the switching device 701 depending on the site at which the switching device 701 is arranged.

Thus, one concept of the invention can be considered to influence, particularly to interrupt, a resonant circuit 202, 203 by means of the switching device 701, somewhere in the current path of the resonant circuit, by means of the switching device 701. In other words, this may mean that it is possible to provide a resonant circuit 202 with any preferred arrangement including a series connection of a capacitor C1, 221 with the switching device 701 and another capacitor, a series connection of a capacitor C1, 221 with the switching device 701 and a coil L1, and/or a series connection of a coil L1 with the switching device 701 and another coil. The coils and/or capacitors may be available in addition to the main coil L1 and the resonant capacitor C1. The series connections can be combined in any manner to the extent that a resonant circuit 202 or oscillating circuit may have a plurality of such basic series connections. The same thing may also apply to corresponding parallel connections. The switching device 701 can thus be used at any points of the resonant circuit 202 and in any combinations and in any preferred number. Arrays can be constructed with series connections and/or parallel connections of capacitors C1, 221, coils L1, and the switching device 701 and switched on and/or off in any combination. Thus, a network of coils L1, capacitors C1, 221, switching devices 701, and the series connections thereof and/or the parallel connection thereof can be constructed. For example, such a network may have up to 50 or more capacitors and/or coils between the filter 200 and coil L1 of the resonant circuit 202. If the switching device 701 is arranged between two capacitors, this can be considered an arrangement of the switching device within an individual capacitor, for example, within the resonant capacitor C1, 221. If the switching device 701 is arranged between two coils, this can be considered an arrangement of the switching device 701 within an individual coil, for example, within the resonant coil L1.

If individual capacitors, coils, and/or networks of coils and networks of capacitors are already available in a resonant circuit, they can be retrofitted at any point and made capable of disconnection by means of the subsequent installation of a switching device.

Figure 5:
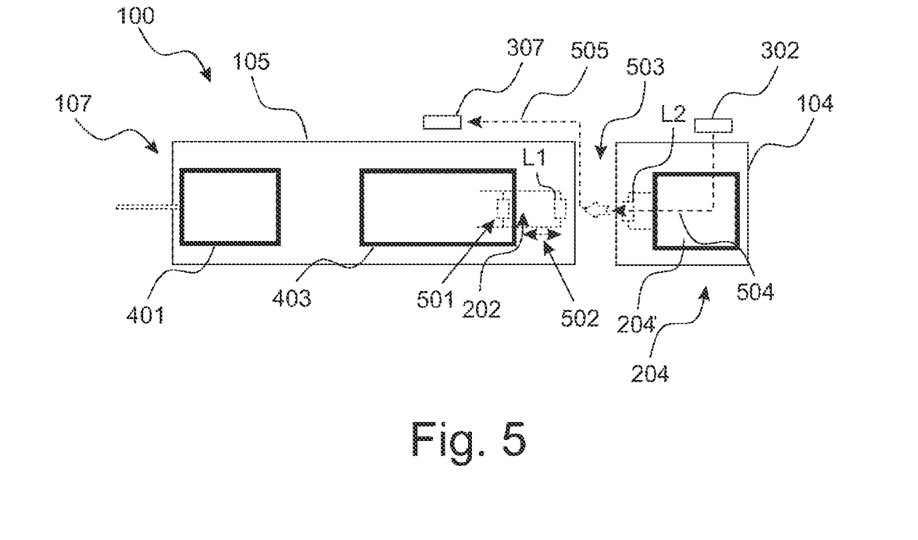
FIG. 5 shows a system for energy transmission during a positioning process for better understanding of the present invention.

FIG. 5 shows a system for energy transmission during a positioning process for better understanding of the present invention. By means of the function blocks, indicated by a solid line, of the transmitter 302 of the positioning system POS and of the evaluating device 307 of the positioning system and the assumed propagation direction of the positioning signal, which is transmitted within the CPM as a signal 504, on the transmission path as an electromagnetic signal 503 and then supplied to the evaluating device 307 as a signal 505 within the GPM 105 via the receiving coils, which are not shown in FIG. 5. The transmitter 302 for the positioning signal excites a POS generator 402', which is switched to the secondary coil L2 between the rectifier 204 and the secondary coil L2, in order to couple the positioning signal to the secondary coil L2. The positioning signal 503 propagates opposite the direction of the energy transmission 106. During the transmission of the positioning signal 503 and particularly during the positioning process taking place as well, there is no energy transmission, i.e., all electronics 403 which are used during the energy transmission are switched to inactive or switched off. Thus, the elements of the energy transmission are not used while the positioning system 302, 307 POS is active.

The components such as, for example, the resonant capacitor C1, 221, used in an inductive charging system for executing oscillations, in addition to the coil L1, are not shown in FIG. 5 for the sake of simplicity.

However, because the adapter network 403 or the coil electronics system 403 has components capable of oscillation, such as coils and capacitors, an input impedance of the outlet of the coil electronics system 403 is available at the coil L1. In this case, the coil electronics system 403 may have all elements which are used during the energy transmission as well as parasitic impedances.

Due to this input impedance 501, the positioning signal 503, which is not determined for the primary resonant circuit 202, induces a current 502 in the inactive main coil L1 which means that a quasi "echo" signal of the positioning signal 503 is transmitted via the main coil L1, which signal disturbs the positioning signal 503, because it interferes, for example, with the positioning signal 503 or position signal 503. The quasi-echo signal may develop, because the positioning signal 503 excites oscillations in the primary resonant circuit 202, and the primary resonant circuit 202 thus functions as an interfering transmitter.

In order to reduce the co-oscillations of the primary resonant circuit 202 during the transmission of the positioning signal 503, a switch can be installed in the primary resonant circuit 202, between the adapter filter 403 and coil L1, which switch disconnects the primary resonant circuit 202 or main resonant circuit 202 or greatly increases the impedance in the frequency range of the positioning signal, i.e., greatly increases the impedance at 125 kHz, during the positioning measurement, i.e., when the positioning signal 503 and particularly the positioning system POS 302, 307 are active. A relay could be used as the switch in one example. However, due to the configuration of coil L1 with the parasitic properties of coil L1 such as, for example, the parasitic capacitance between the coils, a resonant circuit develops in the higher frequency range, for example, in the megahertz range. This resonant circuit can be considered a monopole antenna, which causes EMC interference. This EMC interference can disturb all systems, such as the FOD, LOD, POS.

Figure 6:
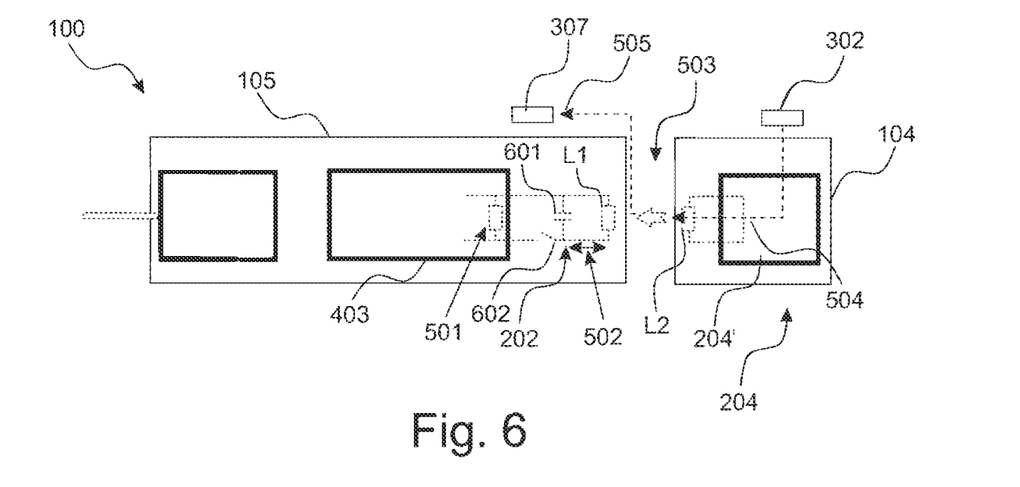
FIG. 6 shows a system for energy transmission during a positioning process with a simple switch for better understanding of the present invention.

FIG. 6 shows a system for energy transmission during a positioning process with a simple switch 602 for better understanding of the present invention. FIG. 6 schematically shows the parasitic impedance 601, particularly the parasitic capacitance 601 which results from the parasitic properties of coil L1. The parasitic capacitance 601 is not a physical structural element. In parasitic capacitance 601, all parasitic effects are unified as a replacement switch indicator which results due to the different effects, for example, of the PCB structure.

In an alternative embodiment, the switch 602 may have two or a plurality of switches instead of a single switch. The described effects develop even in the design with two or a plurality of switches, for example, when a switch and/or a switching device 701 is provided at each of the two coil connection paths, 801 and 802. Furthermore, the resonant capacitors necessary for the inductive energy transmission are omitted in the drawing for simplification, because they can function, like the lines, as a series connection to the main coil L1. An existing structure of capacitors and/or coils between a coil electronic system 403 and coil L1 can be retrofitted with switches and/or a switching device 701.

Figure 7:
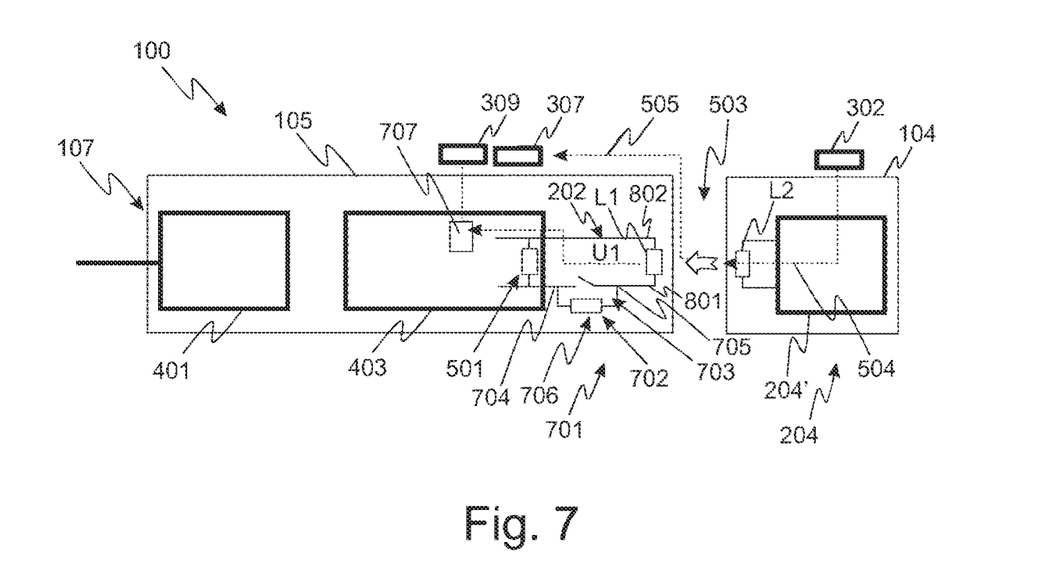
FIG. 7 shows a system for energy transmission during a positioning process with a switching device according to an example embodiment of the present invention.

FIG. 7 shows a system for energy transmission during a positioning process with a switching device 701 according to an example embodiment of the present invention. In order to prevent a resonant circuit in a higher frequency range from developing in the primary resonant circuit 202, the switching device 701 provides for the arrangement of an impedance 702 parallel to a switch 703. Switch 703 and the impedance form the disconnecting device 706.

Even though the switch 602 shown in FIG. 6 can be used for increasing impedance in order to suppress the induced current 502 in that it switches into idle, a resonant circuit forms between L1 and the parasitic capacitance 601, because a connection of the coil L1 has no defined potential due to the switch 602, i.e., it hangs in the air.

In order to ensure a defined potential at both connections 801, 802 of coil L1, an inductance 702 is connected parallel to the switch 703 in the switching device 701. The switch 703 can be implemented by means of a relay or by means of any other switch 703 which is capable of transmitting a large amount of current as is needed for the energy transmission via the coil L1, for example, an IGBT. The parallel-connected impedance 702 is used to damp the oscillations of the main coil L1 and may be implemented as a resistive resistor, i.e., an impedance with a real part. In an alternative embodiment, the resonant circuit 202 may have two or a plurality of switching devices 701 instead of a single switching device 701. The described effects develop even in the design with two or a plurality of switching devices 701, for example, when a switching device 701 is provided at each of the two coil connection paths, 801 and 802. In this manner, whole arrays of capacitors and/or coils can be connected.

The switching device 701 for the coil L1 has an input connection 704, for connecting to the coil electronics system 403, and an output connection 705, for connecting to an end or to a connection of the coil L1. Furthermore, the switching device 701 has a disconnecting device 706, wherein the disconnecting device 706 can be switched between an on-state and an off-state. FIG. 7 shows the disconnecting device 706 in an off-state, thus the switch 703 is open, and the high impedance 702 enables a low current flow in order to prevent interferences.

In the on-state, the disconnecting device 706 connects the input connection 704 and the output connection 705 to an on-impedance. The on-impedance may be determined by means of a short-circuit impedance of the switch 703.

In the off-state, the disconnecting device 703 connects the input connection 704 and the output connection 705 to an off-impedance. The off-impedance may be determined by means of an impedance 702 connected to a switch 703 in parallel.

The off-impedance fulfills further criteria in order to prevent an upswing of an oscillation in the switched-off primary resonant circuit 202, while an external signal 503, for example, a signal different from the energy transmission signal 106, is active, for example, a positioning signal 503. Thus, the off-impedance is to be set such that it has a value which is increased as compared to the on-impedance. This is because the on-impedance should essentially not damp the energy signal 106 to be transmitted during an energy transmission. The energy transmission takes place with a high voltage U1 and/or current I1. Thus, an excessively high impedance is noticeable as a loss and therefore should be avoided.

The off-impedance is configured such that, even though an undesirable oscillation is damped in order to prevent an interference, a flow of current between the input connection 704 and the output connection 705 is not possible, even in the off-state. Furthermore, the off-impedance is configured such that it damps at least one external signal 503 of a definable frequency, which external signal is coupled into the coil, such that this signal does not become unstable, i.e., reach the point of resonance. For example, the off-impedance of the switching device 701 is set at the resonant frequency of a positioning signal 503, which is at 125 kHz, for example.

One concept of the switching device 701 may be considered to provide a suppression circuit in the main coil supply circuit 202 or the primary resonant circuit 202, which has a switching element 703, as well as an impedance 702 connected in parallel thereto. A resistive resistance R, an inductance L, or a capacitance C can be used as the impedance 702. The impedance is used to capture the non-defined potential of the primary coil L1. Further opposing potentials are also possible, for example, the intermediate circuit voltage or the primary HVDC and particularly the PE (Permanent Earth) potential of a voltage supply 107. The switching element 703 may be implemented as a relay 703. Alternatively, the switching element 703 may be formed for switching on very large or very small resistances, inductances, and/or capacitances. The switching element 703 can short-circuit the parallel impedance or render it low-resistance in that a lower impedance is connected in parallel to the impedance. The primary coil L1 may be divided into individual winding components and be split among these individual winding components. In other words, the coil L1 may consist of two or a plurality of individual windings, and one or a plurality of switching devices 701 may be arranged between these individual windings. The winding components or individual windings may be configured such that they can be connected in series, for example, during the energy transmission. A capacitor may also likewise be split into two capacitors by means of a switching device 701. An impedance transformer or transformer may also be used as a switching device 701.

As shown in FIG. 3, a positioning system 302 in the secondary coil L2 generates a positioning signal 503, which is transmitted via the secondary coil L2 and induces a current in the X sensors 302$ax$, 302$bx$, 302$cx$ and the Y sensors 302$ay$, 302$by$, 302$cy$. Moreover, the positioning signal 503 induces a current in the main coil L1 of the GPM 105 as an external signal 503. For the main coil L1, which is provided for the energy transmission, the received positioning signal represents an external signal 503. In order to suppress this external signal so that it does not interfere with reception in the positioning coils 302$ax$, 302$bx$, 302$cx$, 302$ay$, 302$by$, 302$cy$, further adaptations can be carried out on the switching device.

The impedance acting on the main coil L1 for the frequency of the positioning signal should be selected such that it is sufficiently large enough for keeping the transmit capacity of the resulting current 502 from becoming too great to the extent that the position determination can thereby be disturbed.

In the event that the higher impedance or off-impedance results from a switching mechanism 703, such as a relay, the disconnecting device 706 should be designed, in the on-state, such that it has the current-carrying capacity of the coil current I1, or at least a part of I1, which is necessary for the energy transmission, when individual elements are connected in the primary resonant circuit, i.e., when a plurality of switching devices 701 are available, each can carry a part of the current. Because the disconnecting device can be considered a short-circuit for the impedance 702 in the on-state, the on-impedance may substantially be determined in the on-state by means of the impedance of the switch 703. In one example, the switching mechanism 706, particularly the switch 703, may be selected such that it can carry a current, which is selected from the range of from 0 A to 2 A, or from a range of from 0 A to 50 A, and from a range greater than 50 A.

The coil electronics system 403 should be constructed such that the parasitic impedance 601 does not fall below a definable limit value (the parasitic impedance 601 is not shown in FIG. 7 but is present). The parasitic impedance 601 may be influenced, for example, by the circuit layout of the adapter device 403 or the coil electronics system 403. Parasitic capacitances develop between two electrical conductors. These parasitic capacitances may develop particularly in a layout of a PCB (Printed Circuit Board) or a circuit board, which are often designed as multilayered PCBs with conductors arranged on top of each other. This parasitic capacitance 601 is shown in FIG. 6.

Although the parasitic capacitance may not fall below a definable limit value, it also may not be selected to be excessively large. If the parasitic capacitance 601 is too large, the positioning system 302, 307 is disturbed. For example, the design of the circuit board, on which the adapter device 403 or coil electronics system 403 is housed, should thus be designed such that the parasitic capacitance 601 is less than 1 µF or even equal to 1 µF. To this end, the current-conducting elements, such as traces on a PCB which lead to the switching element, must be designed sufficiently narrow or short. In this case, the capacitance can be derived as follows using the Gaussian theorem $$C = \frac{Q}{U} = \varepsilon_0 * \varepsilon_r * \frac{\oint \vec{E} * d\vec{A}}{\int \vec{E} * d\vec{s}}.$$

The selection of a parasitic capacitance from the 0 F to 1 µF range ensures, for example, that only minor interferences occur. A comparison measurement between a position value determined by means of the positioning system 302, 307 and a laser measurement of the coordinates of the CPM-GPM has shown that good correlations are achieved between the measurement by means of the positioning system and the laser measurement with the selection of a parasitic capacitance 601 of less than or equal to 1 µF.

Figure 8:
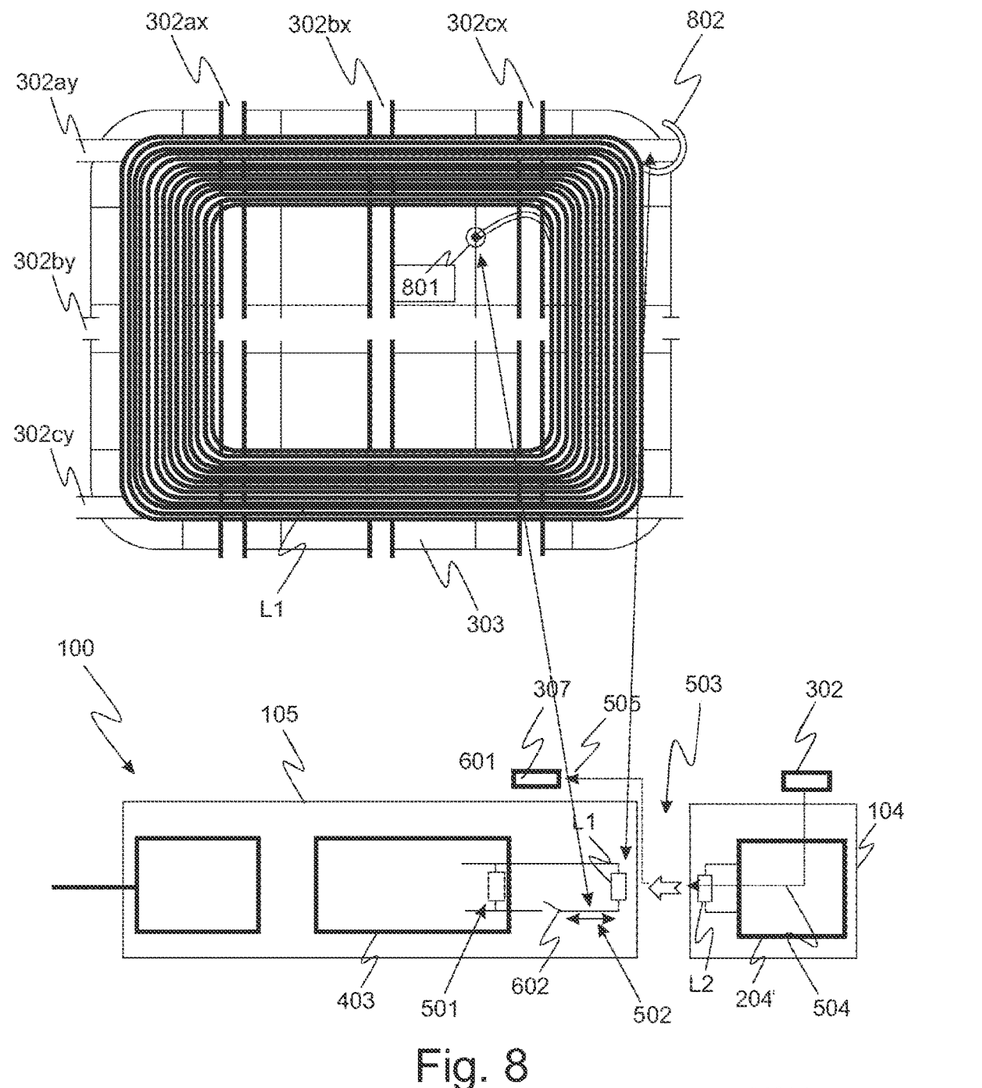
FIG. 8 shows a system for energy transmission during a positioning process with a simple switch and an enlarged view of a coil for better understanding of the present invention.

FIG. 8 shows a system for energy transmission during a positioning process with a simple switch 602 and an enlarged view of a coil for better understanding of the present invention. The switching device 701 can also be used instead of the switch 602. FIG. 8 particularly shows how the coil L1, with a first connection 801, is connected to a first connection of the coil electronics system 403 via the switch 602. In addition, FIG. 8 shows how the coil L1, with a second connection 802, is connected directly to a second connection of the coil electronics system 403. Both connections, 801 an 802, of the coil L1 are guided through the ferrite 303 and attached to a PCB, which is not shown in FIG. 8. The representation in FIG. 8 with the simple switch 602, without the impedance connected to the switch in parallel, ensures that the first connection 801 has an undefined potential, in the case of an open switch 602. Due to the inductance of the main coil L1, a decoupled large antenna results by means of simple opening of the switch 602, and a resonant potential develops by means of the primary resonant capacitor C1, 221 (the primary resonant capacitor C1, 221 is not shown in FIG. 8). Thus, with the switch 602 without parallel impedance, it is only possible to prevent the switched-off end of the main coil L1 from absorbing high-frequency oscillations to a limited extent during the positioning, thus leading to EMC interferences. The connection of the coil L1 to the switch 502 is similar to the connection of the coil L1 to the switching device 701 in FIG. 7.

If the parasitic impedance 601 or the developing impedance 601 is selected to be too low in the circuit according to FIG. 6, which essentially corresponds to the circuit according to FIG. 8, and there is no impedance 702 established parallel to the switch 602, for example, because the surfaces for the lines are selected to be too small on the PCB, the switched-off end 801 may cause an EMC interference. Due to the large inductance of the main coil L1, the non-connected end 801 of the main coil L1 or the end 801 of the main coil L1 connected to the switch 602 functions like an antenna.

In order to suppress these interferences in the megahertz range, an impedance 702 is selected in the switching device 701 parallel to the switch 703 or to another reference potential, which impedance is selected by means of measurements as a function of the interferences to be prevented of the impedance L1 and the parasitic capacitance 601.

Because the magnetic resonance is reciprocal and does not depend on the direction, the description applies independently of the propagation direction of the signal and the type of interference. Thus, the GPM 104 can also function as a transmitter, and the secondary coil L2 can be protected by the switching device 701. There are positioning systems 302, 204', 307 conceivable in which the GPM 105 transmits the external signal and the CPM receives it, and thus the CPM should be protected from interferences. Furthermore, the switching device 701 can be used when the transmitting of a positioning signal does not occur via the CPM main coil, but via transmitting antennas designed in another manner. Discrete solenoid antennas would be conceivable.

Because the LOD, FOD, and/or xOD system responds to changes in the impedance 501 connected to the main coil L1 and/or to the change in the impedance 501 acting on the main coil L1 and/or to general changes in this region, the switching device 701, which carries out changes, due to the switching, to the impedance 501, which is connected to the main coil L1, can be used to set deterministic changes in the impedance in order to test, verify, or monitor the impedance with the sensors of the LOD and/or FOD system. Due to the change in the impedance 501, which loads the coil L1, a large-surface and/or strong change in the impedances 501 is achieved as relates to a reference potential. This occurs because the impedance of the switched-off coil end 801 changes as relates to all other reference potentials during switching of the switch 602. This change in the impedance 501 due to the switch-on and switch-off of the parallel impedance 702 is measurable via the LOD and/or FOD systems. Therefore, these systems can be subjected to a self-test by means of detection of the switching event of the switching device 701.

In one example, the LOD self-test may provide for the detection of a definable frequency shift in the LOD resonant frequency to be expected or a change in the sensor signal during the switchover of the switching device 701 into the off-state or into the positioning mode. If this definable change to be expected, particularly the resonant shift, cannot be verified, it is thus assumed that the LOD system is defective and an alarm is generated. It may be known which frequency shift must be set, for example, of a control unit responsible for the LOD system, once the switching device 701 has been switched into the off-state. In the same manner, known changes in the sensor values of the FOD system can be used to test the function of the FOD system in this manner.

In another example, the switching device 701 can be used during the determination of a coupling factor between the primary coil L1 and the secondary coil L2. This is because the coupling can also be determined by means of the switch-off of the coil with a high impedance in the off-state of the switching device 701.

A coupling factor determination device is provided for this in the primary resonant circuit 202. Due to the switch-off of the main coil L1 with the switching device 701, the primary-side main coil L1 is loaded with a high impedance, namely the total of the impedance 501 of the adapter device and the high impedance 702, which is switched on in the off-state of the switching device 701, in order to prevent an idle. Because the transmit current in the coil L2 and the coil voltage U2 in the CPM 104 as well as the primary inductance L1 are known, the coupling factor k can be determined by the measurement of the voltage U1 on the primary side.

The voltage U1 is previously processed during the energy transmission in order to adjust the flow of power. Thus, all of the measuring equipment for a measurement of U1 is already available in the energy transmission system 100, and the control unit 307 must only be adapted such that it calculates and provides the coupling factor k from the measurement of the primary voltage U1. During determination of the coupling factor k, instead of the calculation of the power which is measured during energy transmission, the voltage U1 induced in the coil L1 by the positioning signal during the positioning process is measured and the coupling factor k is determined therefrom. Alternatively, the current I1 in the primary resonant circuit 202, which results during the transmission of the positioning signal instead of the energy transmission, could also be measured. The switching device 703 enables the coupling to be determined very precisely when the voltage measurement is implemented at the correct point.

In order to achieve a good measuring result, the measuring equipment must be constructed such that it can easily determine the voltage between the coil connections, 801 and 802. The resonant capacitors 221 of the inductive energy transmission system in this case can be dispensed with due to the negligible current flow. By switching into the off-state, the switching device 703 can prevent a current, particularly a large current, from being induced in the primary resonant circuit 202. Because the low current flow can be achieved in the off-state, this off-state is often selected in order to determine the coupling.

The measuring equipment may have an analog circuit 707 for the voltage measurement. The analog circuit 707 of the voltage measuring device, which is used to measure the voltage U1, is arranged in the adapter device 403, as is shown in FIG. 7. This voltage and/or current measuring device 707, which is implemented as a circuit with analog components, has two measuring zones, which the control unit 309, particularly a microcontroller, can select, which is responsible for the control of the GPM 105, particularly is responsible for the control of the energy transmission. This control unit 309 for the energy transmission system can communicate with the control unit 307 for the positioning system.

Figure 9:
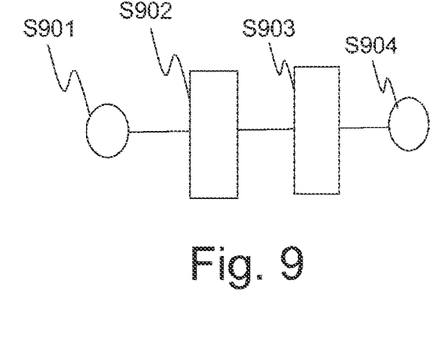
FIG. 9 shows a flowchart of a method for switching a switching device according to an example embodiment of the present invention.

FIG. 9 shows a flowchart of a method for switching a switching device 701 according to an example embodiment of the present invention. The method starts in the idle state S901, and detects the presence of an external signal 503 in state S902, either by means of a measurement, by means of a switchover pulse for the switching device 701, or by means of signaling via the WLAN channel 101, which indicates that a positioning is being executed. In state S903, there is a switching of the disconnecting device 706 into the off-state in order to implement a positioning process essentially without interferences from the EMC signals or reflections. The method ends in state S904.

In an alternative example embodiment, the switching device can be switched into the on-state before the method ends.

Figure 10:
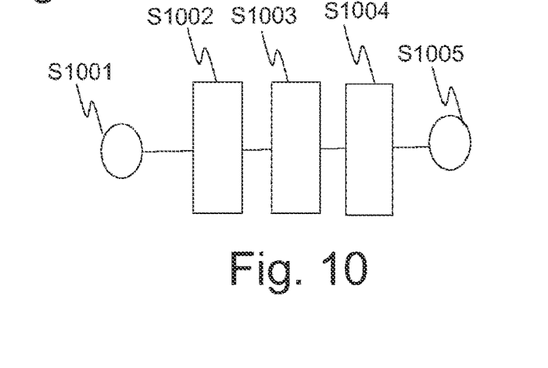
FIG. 10 shows a flowchart of a method for testing an impedance-sensitive system with a switching device according to an example embodiment of the present invention.

FIG. 10 shows a flowchart of a method for testing an impedance-sensitive system with a switching device according to an example embodiment of the present invention. The method starts in the idle state S1001. In state S1002, there is switching of the disconnecting device 706 into the on-state and the implementing of a first measurement with the impedance-sensitive system which is to be tested, for example, an LOD and/or an FOD system.

In state S1003, the method provides for the switching of the disconnecting device 706 into the off-state and the implementing of a second measurement with the impedance-sensitive system. Due to the switching on and off of the disconnecting device 706, an impedance change of an object, for example, of a passive primary-side resonant circuit 202, may be induced, to which the impedance-system responds.

In state S1004, there is a comparison of the results of the first measurement and the second measurement and verification of the comparison with a target specification, particularly with an expected result. If the impedance-sensitive system is functioning properly, a change in the impedance of the object should be detectable. The correct function and/or a malfunction is then displayed depending on the verification.

In order to complete the method, there is a transition into the idle state S1005.

It should be noted in addition that "comprising", "including", and "having" does not exclude any other elements or steps and "one" or "a" does not exclude any plurality. Furthermore, it should be noted that features or steps which have been described with reference to one of the previous example embodiments may also be used in combination with other features or steps of other previously described example embodiments. Reference numerals in the claims are not to be considered a limitation.

The invention claimed is:

1. A method of testing an impedance-sensitive system with a switching device, the switching device comprising an input connection configured to connect to a coil electronics system and/or to a resonant circuit capacitor, an output connection configured to connect to an end of a coil and/or to the resonant circuit capacitor, and a disconnecting device comprising a switch and an impedance connected in parallel, the disconnecting device being switchable between an on-state and an off-state using the switch, wherein in the on-state the disconnecting device is configured to connect the input connection and the output connection to an on-impedance when the switch is closed, wherein in the off-state the disconnecting device is configured to connect the input connection and the output connection to an off-impedance determined by the impedance connected in parallel when the switch is open, wherein the off-impedance has an increased value compared to the on-impedance, permitting a current flow between the input connection and the output connection while damping an external positioning signal of a definable frequency that couples into the coil so as to reduce undesirable oscillations of the coil, the method comprising:
   switching the disconnecting device into the on-state configured to permit transmission of energy via the coil;
   implementing a first measurement with the impedance-sensitive system;
   switching the disconnecting device into the off-state configured to permit damping of the external positioning signal that couples into the coil so as to reduce the undesirable oscillations of the coil;

implementing a second measurement with the impedance-sensitive system;

performing a comparison of the first measurement and the second measurement;

performing a verification of the comparison with a target specification; and displaying a correct function and/or a malfunction depending on the verification.

2. The method of claim 1, further comprising coupling the switching between the on-state and the off-state to switching of the external positioning signal.

3. The method of claim 1, further comprising:

detecting a presence of the external positioning signal; and switching the disconnecting device into the off-state based on detecting the presence of the external positioning signal.

4. The method of claim 1, further comprising switching the disconnecting device into the off-state in order to carry out a test.

5. The method of claim 1, further comprising arranging the switching device in a car pad module CPM and/or in a ground pad module GPM of a car inductive charging system.

6. The method of claim 1, further comprising:

forming a resonant circuit comprising the switching device, the coil, and the coil electronics system;

connecting a first coil connection of the coil to a first connection of the coil electronics system via the switching device; and connecting a second coil connection of the coil to the first connection of the coil electronics system.

7. The method of claim 6, further comprising arranging the resonant circuit in a car pad module CPM and/or in a ground pad module GPM of a car inductive charging system.

8. The method of claim 1, further comprising selecting the impedance connected in parallel as a resistance or a combination of the resistance with an impedance selected from the group of impedances consisting of: an effective impedance; a blind impedance; a capacitor; a capacitance; a parasitic element; a parasitic capacitance; and a coil.

9. The method of claim 1, further comprising generating the positioning signal based on an alignment position of a car pad module CPM and a ground pad module GPM of a car inductive charging system.

10. The method of claim 1, further comprising transitioning into an idle state after displaying the correct function and/or the malfunction.

* * * * *